United States Patent [19]

Busch et al.

[11] Patent Number: 4,807,195

[45] Date of Patent: Feb. 21, 1989

[54] APPARATUS AND METHOD FOR PROVIDING A DUAL SENSE AMPLIFIER WITH DIVIDED BIT LINE ISOLATION

[75] Inventors: Robert E. Busch; Endre P. Thoma, both of Colchester, Vt.

[73] Assignee: International Business Machines Corporation, Armonk, N.Y.

[21] Appl. No.: 50,361

[22] Filed: May 18, 1987

[51] Int. Cl.$^4$ .................. G11C 7/00; G11C 11/24
[52] U.S. Cl. ..................... 365/207; 365/149
[58] Field of Search ............. 365/149, 203, 207, 208, 365/210; 307/355, 530

[56] References Cited

U.S. PATENT DOCUMENTS

| | | | |
|---|---|---|---|
| 4,070,590 | 1/1978 | Ieda et al. | 307/355 |
| 4,287,576 | 9/1981 | Pricer | 365/203 |
| 4,312,047 | 1/1982 | Donoghue | 365/189 |
| 4,351,034 | 9/1982 | Eaton, Jr. et al. | 365/189 |
| 4,367,540 | 1/1983 | Shimohigashi | 365/207 |
| 4,375,600 | 3/1983 | Wu | 307/530 |
| 4,402,066 | 8/1983 | Itoh et al. | 365/189 |
| 4,498,154 | 2/1985 | Hoffmann | 365/149 |

OTHER PUBLICATIONS

1983 IEEE International Solid–State Circuits Conference, Friday, Feb. 25, 1983, 10:45 a.m., pp. 230–231, J. Moench et al., "A Sub 100 ns 256K DRAM".
1983 IEEE International Solid–State Circuits Conference, Friday, Feb. 25, 1983, 11:45 a.m., pp. 234–235, T. Mano et al., "Submicron VLSI Memory Circuits".
1983 IEEE International Solid–State Circuits Conference, Wednesday, Feb. 23, 1983, 3:30 p.m., pp. 56–57 and 285–286, R. Chwang et al., "A 70 ns High Density CMOS DRAM".
Mashiko et al, "A 4-Mbit DRAM with Folded-Bit-Line Adaptive Sidewall Isolated Capacitor (FASIC) Cell", IEEE Journal of Solid–State Circuits, vol. SC-22, No. 5, Oct. 1987.

*Primary Examiner*—Joseph A. Popek
*Attorney, Agent, or Firm*—Sughrue, Mion, Zinn, Macpeak and Seas

[57] ABSTRACT

A dual sense amplifier construction with divided bit line isolation. A switch is disposed at approximately the midpoint of a bit line to divide the bit line into first and second bit line segments. When opened, the switch provides electrical isolation between the first and second bit line segments so that an accessed memory charge can be isolated from one-half of the capacitance associated with the bit line. Once the isolated memory charge is read and pre-amplified, the remaining bit line capacitance is no longer of concern. The switch is then closed to provide electrical connection between the first and second bit line segments, thereby allowing the completion of the amplification operation.

21 Claims, 5 Drawing Sheets

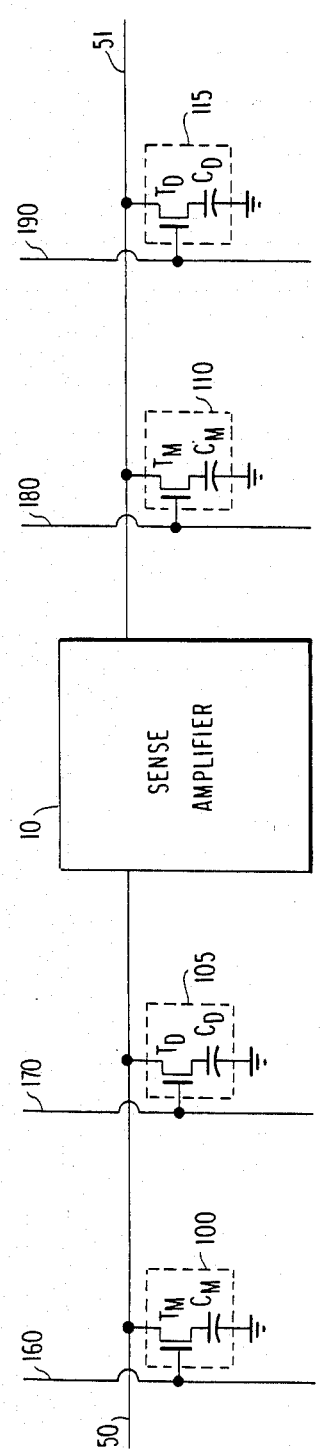
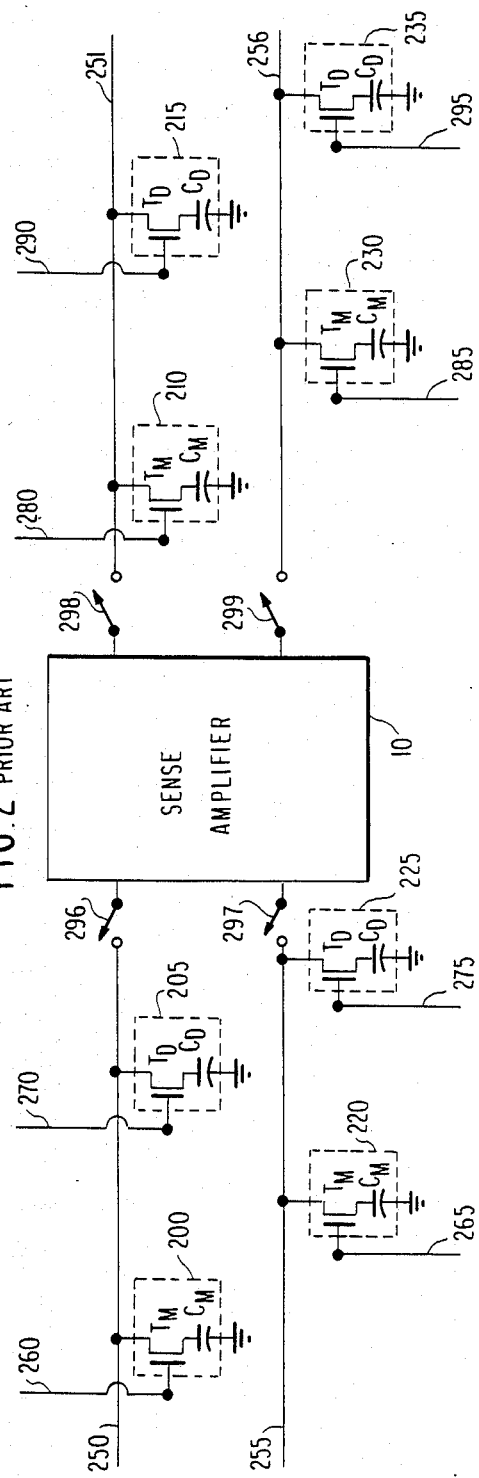

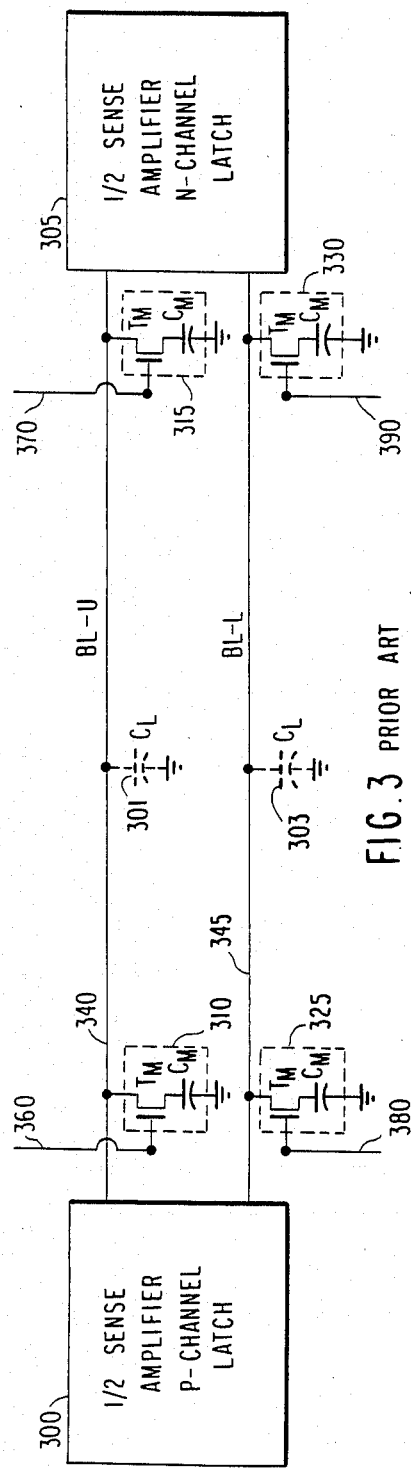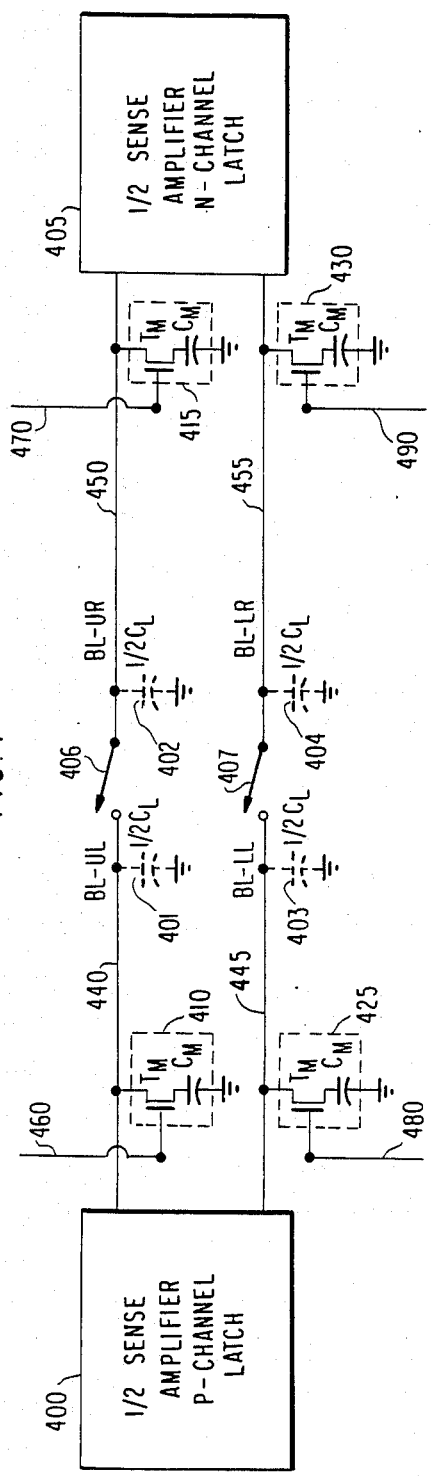
FIG. 3 PRIOR ART
FIG. 4

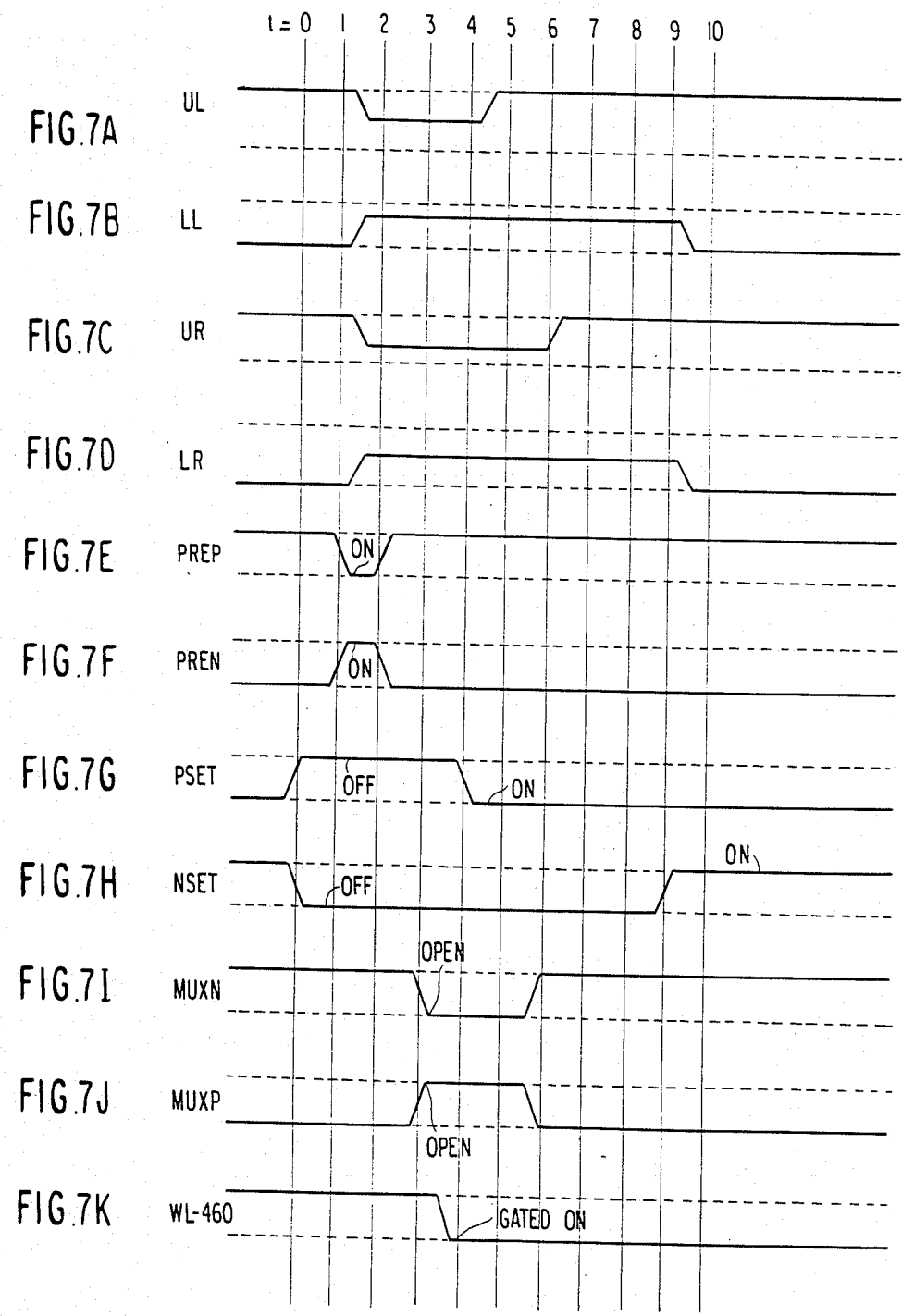

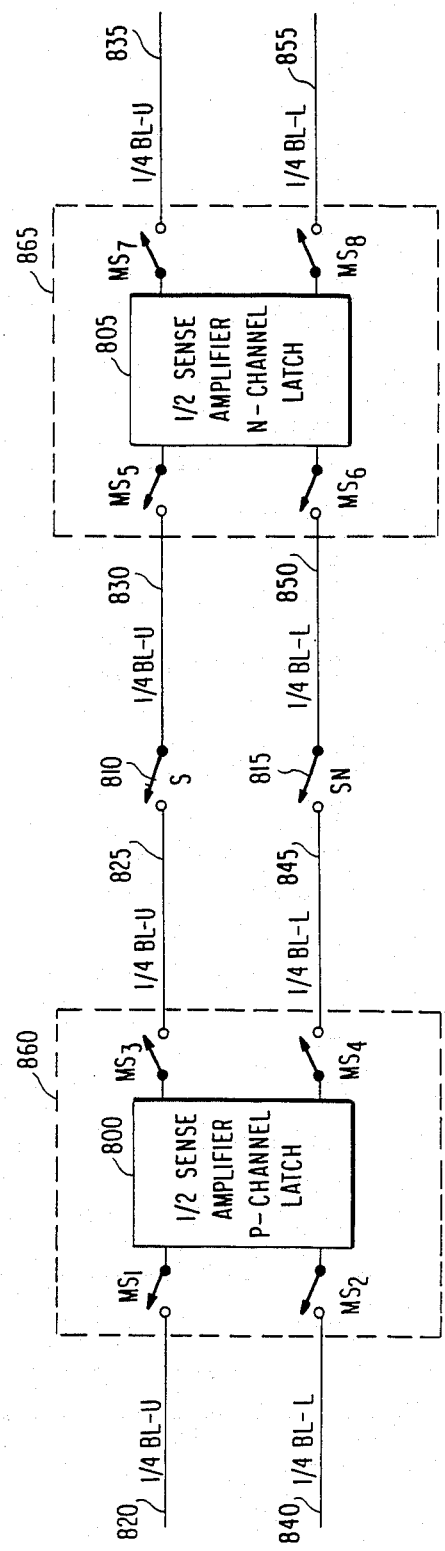

APPARATUS AND METHOD FOR PROVIDING A DUAL SENSE AMPLIFIER WITH DIVIDED BIT LINE ISOLATION

BACKGROUND OF THE INVENTION

1. Field of the Invention

The present invention relates to an improvement in the operation of MOS (metal-oxide-semiconductor) memories and, more specifically, to the use of divided bit line isolation within dual sense amplifier constructions.

2. Description of the Prior Art

Research and development in semiconductor technology have produced semiconductor memories with tremendous capacity and performance characteristics. Today, semiconductor memories can be divided into two classes: static memories and dynamic memories. Static memories are not of interest here and will not be discussed. However, an example of a static memory can be found in U.S. Pat. No. 4,402,066, issued to Itoh et al, which discloses an improved static memory circuit having reduced read access time.

FIG. 1 shows a simplified prior art dynamic memory array in which a sense amplifier 10 is flanked by oppositely placed bit lines 50 and 51. The actual circuitry of the sense amplifier 10 is not of concern here and will not be discussed. In the typical dynamic memory shown in FIG. 1, digital data is stored in a matrix of memory cells, each of which has a capacitor for storing a charge corresponding to a logical 1 or 0. A memory cell capacitor $C_M$ is shown for each of the memory cells 100 and 110 in FIG. 1.

The memory cell capacitors $C_M$ are connectable to an associated bit line by an isolation transistor $T_M$ of each of the memory cells 100 and 110. The memory cell isolation transistors $T_M$ of the memory cells 100 and 110 are controlled by word lines 160 and 180, respectively.

At this point, it should be noted that, in a typical dynamic memory, a large number of memory cells is associated with each bit line. For sake of simplicity of discussion, the bit lines are shown with only one or a small number of memory cells.

In addition to the memory cells 100 and 110, the sense amplifier construction of FIG. 1 also requires the use of reference cells, oten called "dummy cells". Unlike memory cells, only one "dummy cell" is typically associated with any given bit line. Dummy cells are indicated by reference numerals 105 and 115 for bit lines 50 and 51, respectively. The dummy cells 105 and 115 are controlled by the word lines 170 and 190, respectively, and have a construction similar to that of memory cells. The charge stored in the dummy capacitor is used as a reference charge with which to compare the charge of the memory cell capacitor.

For a sense operation with the sense amplifier construction of FIG. 1, two bit lines must be used. The first bit line is used to access the memory charge stored in an addressed memory cell, and the second is used to access a reference charge in a "dummy cell". To begin the sense operation, the isolation transistor $T_M$ of an addressed memory cell is turned on by a signal along the appropriate word line 160 or 180. Once the isolation transistor $T_M$ is turned on, the charge on the memory cell capacitor is allowed to transfer to a first bit line. In a similar fashion, the charge on the dummy cell capacitor is allowed to transfer to a second bit line. The resulting differential voltage across the two bit lines is sensed by sense amplifier 10, and is used as an indication of whether the memory cell had stored a logical 1 or a logical 0.

Research and development in semiconductor technology and memory array construction have also produced numerous improvements to dynamic memory arrays. For example, U.S. Pat. No. 4,375,600, issued to Wu, discloses a sense amplifier which employs an FET circuit for amplifying the bit signal which has been attenuated by stray capacitance, and which would otherwise be exceeded by circuit noise voltages. U.S. Pat. No. 4,070,590, issued to Ieda et al, discloses a sensing circuit, wherein power supply transistors are inserted between power sources and bit lines, and separation transistors are inserted between a sense amplifier and each bit line. The power supply transistors allow the signal detection to be performed with little power consumption, and the separation transistors enable the device to have a high-speed and highly sensitive detecting operation. U.S. Pat. No. 4,312,047, issued to Donoghue, discloses a memory array using diode connected transistors to provide isolation between common bit line pairs, and between each bit line and its associated column select circuitry. This improvement produces higher operating speeds and better differential signals for sensing by the sense amplifier. In the 1983, *IEEE International Solid-States Circuits Conference* publication, dated Feb. 25, 1983, pages 234 and 235, and entitled "Session XVI:256K DRAMs", there is disclosed a construction of a 256K DRAM having an on-chip error checking and correcting (parity) circuit and a threshold difference compensated amplifier.

One improvement, which has been developed with respect to the dynamic memory array of FIG. 1, is that of a shared sense amplifier. This shared sense amplifier approach will be described with reference to FIG. 2 in which the sense amplifier 10 remains the same as in FIG. 1, but is associated with additional bit lines 250, 251, 255 and 256.

Along the bit lines 250, 251, 255 and 256, memory cells 200, 210, 220 and 230 are controlled by the word lines 260, 280, 265 and 285, respectively. Similarly, dummy cells 205, 215, 225 and 235 are controlled by the dummy lines 270, 290, 275 and 295, respectively.

As to the association of the bit lines with the sense amplifier, each of the bit lines 250, 251, 255 and 256 can be connected to the share sense amplifier 10 by the multiplex switches 296, 298, 297 and 299, respectively. In a sense operation with the construction shown in FIG. 2, two of the multiplex switches 296, 298, 297 or 299 are closed such that one bit line can act as a memory cell bit line, and a second bit can operate as a dummy cell bit line. Further discussions of a dynamic memory with a shared sense amplifier construction can be found in the above-cited publication, pages 230 and 231. In addition to the above publication, U.S. Pat. No. 4,351,034, issued to Eaton et al, also discloses a shared sense amplifier arrangement with the additional improvement of utilizing the construction in a folded bit line manner.

This folded bit line improvement can also be illustrated with reference to FIG. 2. In the shared sense amplifier construction shown in FIG. 2, opposite or diagonally opposite bit lines were initially used as a bit line pair. As an example, bit line 250 would be associated with either bit line 251 or bit line 256. This opposite bit line arrangement was found to be undesirable because of circuit noise. Since the bit lines in a associated pair are separated, each bit line is exposed to circuit noise which is different from that of the other bit line. The different noise levels on each of the bit lines may be erroneously sensed as a differential voltage across the bit line pair and, therefore, substantially affect the sensitivity of the sense amplifier. Eaton et al discloses a folded bit line which eliminates this noise problem.

In Eaton et al, bit lines which are closely placed and on the same side of the sense amplifier are chosen as bit line pairs. Thus, for example, in FIG. 2, bit lines 250 and 255 or bit lines 251 and 256 would be chosen as bit line pairs. As the chosen bit line pairs are closely placed, both bit lines are exposed and therefore have the same noise level and waveform induced along each line. As the sense amplifier senses only the differential voltage across a bit line pair, common noise appearing on each bit line will be ignored by the sense amplifier 10. Thus, the folded bit line construction results in an excellent common mode noise rejection ratio.

Although the above prior art has achieved dynamic memories having tremendous capacity and performance characteristics, improvements in dynamic memories have continued to evolve. A recent area of great interest is the dynamic memory array using a dual sense amplifier construction. Recent prior art directed to a dual sense amplifier is the 1983 *IEEE International Solid-States Circuit Conference* publication, dated Feb. 23, 1983, pages 56, 57 and pages 285 and 286, entitled "Section D-I: CMOS Memory".

A prior art dual sense amplifier construction will be described with reference to FIG. 3 which shows a dual sense amplifier consisting of a P-channel latch 300 and an N-channel latch 305. In contrast to the single sense amplifier construction of FIGS. 1 & 2, the dual sense amplifier construction shown in FIG. 3 utlizes a first half of a sense amplifier spaced at a distance from a second half of the sense amplifier.

Shown disposed between the sense amplifier halves are bit lines 340 and 345, with the first ends of bit lines 340 and 345 being connected to the P-channel latch 300, and the second ends of the bit lines 340 and 345 being connected to the N-channel latch 305. Disposed along the bit lines 340 and 345 are the memory cells 310, 315, 325 and 330 which are controlled by the word lines 360, 370, 380, 390, respectively. Memory cell construction is the same as that which was described with reference to FIG. 1. It should again be noted the number of memory cells along bit lines 340 and 345 in FIG. 3 has been limited for the sake of clarity. In contrast to the previously described single sense amplifier approach, the need for "dummy" reference cells has been eliminated. Thus, there is an absence of "dummy" cells along bit lines 340 and 345 in FIG. 3.

Although the dual latch construction for the sense amplifier can be designed in any MOS technology, this construction is realized particularly well in CMOS (Complementary Metal Oxide Semiconductor) technology. Thus, in a preferred embodiment, CMOS technology is used in the construction of the dual sense amplifier. The operation of the dual sense amplifier memory as shown in FIG. 3 will now be described.

Before a sense operation is begun, the bit lines 340 and 345 are momentarily shorted together by the sense amplifiers halves 300, 305 to insure that the two bit lines are charged to the same voltage level. To sense the state of an addressed memory cell, the appropriate word line is activated to cause the memory cell isolation transistor to turn on and, therefore, transfer the charge of the memory cell's capacitor onto the respective bit line. In addition to the memory cell charge which has been dumped onto the first bit line, the charge on the opposite bit line is also used by the dual sense amplifier as a reference charge. In the sense operation, both the P-channel latch 300 and N-channel latch 305 provide a partial amplification of the sense memory value, one of the latches pulling the more positive line toward the positive supply voltage, and the other latch pulling the more negative line toward the negative supply voltage. The combined effect is a full amplification by the P-channel latch and N-channel latch to provide a full differential power supply level across the two bit lines. The output circuitry of the dual sense amplifier construction is not of importance to the present invention and, therefore, is not shown.

At this point, it is useful to note the differences between the dual sense amplifier construction of FIG. 3 and the sense amplifier construction which were previously described with reference to FIGS. 1 and 2. In contrast to the prior art devices shown in FIGS. 1 and 2, the memory array of FIG. 3 utilizes a dual sense amplifier construction with a P-channel latch spaced apart from an N-channel latch. As each of the dual sense amplifier halves must provide a portion of the total amplification required to complete a sense operation, both sense amplifier halves must be connected to a bit line in order to provide the reqired amplification of the memory value sensed along a given bit line. Thus, the bit lines of FIG. 3 are disposed between the sense amplifier halves, instead of flanking a single sense amplifier construction as shown in FIGS. 1 and 2.

Although the dual sense amplifier memory construction shown in FIG. 3 has been an important development in memory technology, there remains a need for further improvement, as will be discussed below.

As mentioned previously, digital data in a dynamic memory is stored in dynamic memory cells. When a particular memory cell is addressed, a memory cell capacitor $C_M$ is coupled to an associated bit line via an isolation transistor $T_M$. As a result, a transfer of charge occurs between the memory cell capacitor and the bit line, thereby altering the voltage level on that bit line. In a practical device, the amount of voltage change induced has been found to be dependent on the capacitance along the associated bit line. This bit line capacitance can be attributed to the capacitance of the line itself, and also, to the capacitance due to other memory cells associated with the bit line. This capacitance $C_L$ is illustrated in FIG. 3 as capacitors 301 and 303 for bit lines 340 and 345, respectively.

During the transfer of charge in a sense operation, the memory charge stored in the memory cell capacitor must first be used to satisfy any bit line capacitance before it can induce any voltage change along the associated bit line. The larger the bit line capacitance $C_L$, the larger the portion of memory charge used to satisfy the bit line capacitance. The larger the amount of memory charge used to satisfy the bit line capacitance, the smaller the change in voltage level induced along that line. Thus, there must be sufficient memory charge stored within the memory cell capacitor $C_M$ with which to satisfy the bit line capacitance $C_L$, and produce along the bit line sufficient change in voltage which can be sensed and amplified.

As the size of the memory cell capacitor in a practical semiconductor memory is limited, so is the amount of memory charge which can be stored in this memory cell capacitor. Because this limited memory charge must be sufficient to overcome the bit line capacitance $C_L$ and produce sufficient voltage change, the bit line capacitance $C_L$ must not be greater than a certain maximum capacitance value. As the bit line capacitance $C_L$ is determined by both the bit line length and the number of memory cells associated with the bit line, it follows that the combination of bit line length and memory cells associated with the bit line is limited by the practical size limitations imposed on the memory cell capacitor $C_M$.

Although such limitations still allow bit lines to have a large number of associated memory cells, the greater the number of memory cells that can be associated with a given bit line and sense amplifier, the more efficient the use of expensive semiconductor substrate area. Stated differently, semiconductor memory devices wit greater memory array density can be constructed more cheaply if more memory cells can be associated with a given bit line and sense amplifier. Thus, there exists a need for an approach which will allow a greater number of memory cells to be associated with a given bit line in a memory device utilizing a dual sense amplifier construction.

SUMMARY OF THE INVENTION

The object of the present invention is to provide a unique apparatus and method for satisfying the aforementioned needs.

More specifically, the present invention uses an approach which employs a switch to divide a bit line into two bit line segments. If the switch is closed, the bit line segments are connected, and, therefore, the entire bit line is subjected to the entire bit line capacitance. If the switch is opened, the bit line is divided into a first bit line segment and a second bit line segment, each having one-half of the bit line capacitance. In a sense operation, the switch is opened just before the memory charge in the memory cell capacitor is to be transferred to the bit line so that the memory charge will have to satisfy only one-half of the bit line capacitance, and a greater voltage change will be induced. This voltage change is sensed and pre-amplified by a first sense amplifier half. In closing the bit line switch to allow the completion of amplification, the sensed memory value has already been partially amplified so that the effects of the other one-half of bit line capacitance is negligible.

Thus, the present application provides a divided bit line isolation approach which can be used with dual sense amplifier constructions. More specifically, with the divided bit line isolation approach described above, twice as many memory cells can be associated with a given bit line since one-half of these memory cells can be isolated at any given time. Alternatively, smaller memory cell capacitors can be used because only one-half of the bit line capacitance must be satisfied, thereby providing, in turn, memory array devices which have greater memory capacity and which can be constructed more cost effectively.

These and other objects and advantages of the invention will become more fully apparent from the following description made in connection with the accompanying drawings, wherein:

BRIEF DESCRIPTION OF THE DRAWINGS

FIG. 1 is a simplified circuit diagram of a prior art memory array utilizing a singular sense amplifier construction.

FIG. 2 is a simplified circuit diagram of a memory array having the singular sense amplifier construction, of FIG. 1, with the further improvements of utilizing shared sense amplifier and folded bit line approaches.

FIG. 3 is a simplified circuit diagram of a prior art dynamic memory array utilizing a dual sense amplifier having a P-channel latch and N-channel latch construction.

FIG. 4 is a simplified circuit diagram of the dynamic memory array shown in FIG. 3 and further incorporating an embodiment of the divided bit line isolation approach of the present invention.

FIGS. 7A through 7K show timing waveforms at various locations of the simplified circuit shown in FIG. 6.

FIG. 8 is a simplified circuit diagram showing another preferred embodiment of the present invention, further utilizing shared sense amplifier and folded bit line approaches.

DETAILED DESCRIPTION OF PREFERRED EMBODIMENTS

Figure 5:
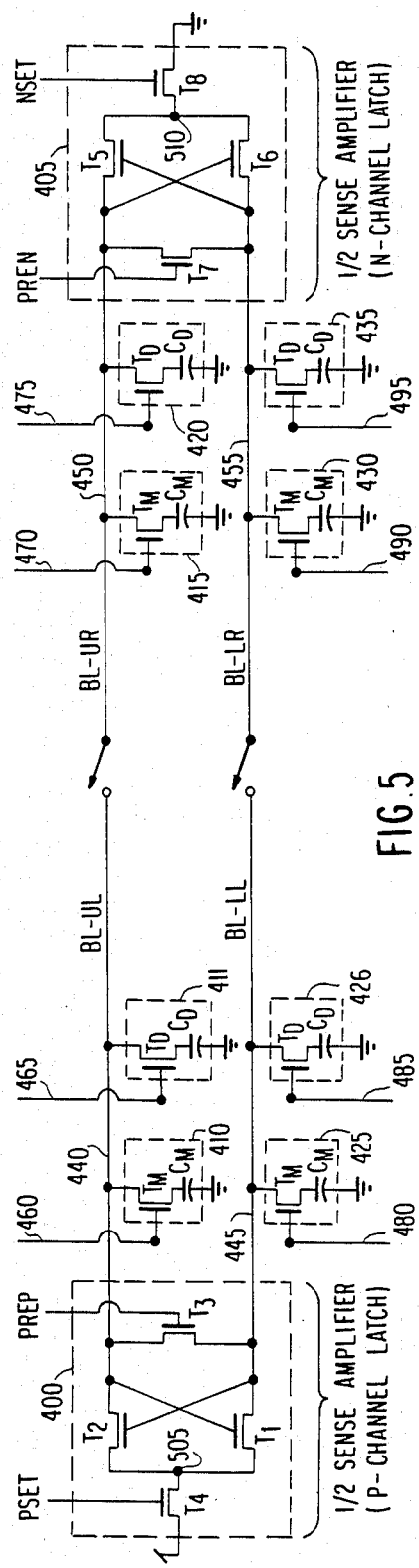
FIG. 5 illustrates the simplified circuit diagram of FIG. 4, but with the dual sense amplifier shown in greater detail.

Turning now to a detailed description of a preferred embodiment of the present invention, FIG. 4 is a simplified circuit diagram similar to that shown in FIG. 3. In particular, a first sense amplifier half 400 is placed apart from a second sense amplifier half 405. The first sense amplifier half 400 is shown as a P-channel latch, and the second sense amplifier half 405 is shown as a N-channel latch.

As with the prior art construction described above, two bit lines must be used during each sense operation. To simplify the descriptions, the bit lines disposed between the P-channel latch 400 and the N-channel latch 405 will be called upper and lower bit lines. In addition, as the following description will show that the present invention produces the division of the bit lines into segments, these segments will be called upper and lower, left and right bit line segments.

The circuit shown in FIG. 4 deviates from the prior art circuit in that switches 406 and 407 have been incorporated to provide the divided bit line isolation of the present invention. More specifically, switch 406 has been incorporated to divide an upper bit line into an upper left bit line segment 440 and an upper right bit line segment 450. Similarly, a switch 407 has been incorporated to divide a lower bit line into a lower left bit line segment 445 and a lower right bit line segment 455. When the switch 406 is opened, the bit line length and memory cells associated with the upper left bit line segment 440 can be isolated from the bit line length and memory cells associated with the upper right bit line segment 450. In a preferred embodiment, the switch 406 is incorporated at the center of a bit line; therefore, each one-half of the bit line can be isolated from one another. When the switch 406 is opened, the capacitance associated with the upper left bit line segment 440 is approximately one-half the bit line capacitance which would be associated with the entire length of the upper bit line. Although the above description refers only to the upper left bit line segment, a similar description would apply to the upper right, lower left, and lower right bit line segments 450, 445 and 455, respectively.

The operation of the divided bit line approach of the present invention will now be described in further detail. It is assumed that it is desired to access the memory value stored in memory cell 410. Before the sense operation is initiated, the upper and lower bit lines are momentarily shorted together by the sense amplifier halves 400, 405 to insure that both bit lines are at the same voltage levels. After the shorting operation, the switch 406 is opened to isolate the upper left bit line segment 440 from the upper right bit line segment 450. The word line 460 associated with the memory cell 410 is then activiated to turn on the isolation transistor $T_M$. Once the isolation transistor $T_M$ is turned on, the memory charge in the memory cell capacitor $C_M$ is allowed to transfer to the upper left bit line segment 440.

As described above, when a memory charge is transferred to a bit line, part of that memory charge must be used to satisfy the capacitance associated with that line. Since the switch 406 has been previously opened, the capacitance associated with the upper left bit line segment 440 is effectively isolated from the line capacitance associated with the upper right bit line segment 450. Thus, the capacitance associated with the upper left bit line segment 440 is effectively one-half of the normal upper bit line capacitance, as indicated by the capacitor 401 in FIG. 4. Thus, when the memory charge is transferred to the divided bit line in the present invention, much less memory charge is needed to satisfy the capacitance associated with that bit line segment, whereby more charge is available to alter the voltage along that bit line segment.

Since the memory charge is transferred to the upper left bit line segment 440, the P-channel latch 400 senses, and provides partial amplification of, that memory value along the upper left bit line segment 440. Because the transfer of memory charge has been more efficiently used to produce a greater voltage change, there is provided a greater guarantee that the P-channel latch will be latched to the appropriate state, and that this latching operation will occur much more quickly. Once the memory charge value along the upper left of bit line segment 440 has been partially amplified by the P-channel latch, the memory charge along the line is of a sufficient voltage level that the second half of bit line capacitance is no longer of concern. Thus, once the memory charge value has been boosted, the switch 406 is closed to effectively rejoin the upper left bit line segment 440 with the upper right bit line segment 450. Once reconnected, the memory charge value along the upper left bit line segment 440 is allowed to transfer to the upper left bit line segment 450. The memory charge value is thus applied to the N-channel latch construction 405 whose operation is such that it produces along the lower bit line (445 and 455) a voltage change which is complementary to the voltage change produced by the P-channel latch 400 along the upper bit line.

Thus the present invention produces a division of the amplification process into a pre-amplification stage and, then, a complementary amplification stage. To accomplish this result, first the bit line switch is used to divide the dual sense amplifier memory array into two halves. Then, a memory charge value is accessed and pre-amplified along a first bit lin ein a first memory array half. The bit line switch is then closed to rejoin the memory array halves, and the second memory array half is allowed to provide the complementary amplification along the second bit line.

It should be noted that the P-channel latch 400 is not dedicated to producing amplification along the lower bit line, and the N-channel latch 405 is not dedicated to producing amplification along the lower bit line. For instance, in the above example with a logical 1 stored in the memory cell 410, the P-channel latch provided pre-amplification along the upper bit line, and the N-channel latch provided complementary amplification along the lower bit line. If instead, a logical 0 charge had been stored in the memory cell 410, the P-channel latch 400 would have produced amplication along the lower bit line, and the N-channel latch 405 would have produced amplification along the upper bit line.

It should also be noted that, in addition to being able to provide amplification along either the upper or lower bit lines, the P-channel and the N-channel latches are also interchangeable relative to the amplification stages. In the above example, the P-channel latch provided pre-amplification because the accessed memory cell was in the left memory array half, and then the N-channel latch provided the complementary amplification. If the memory cell accessed were instead in the right memory array half, the amplification operations of the latches would be interchanged, with the N-channel providing the pre-amplification operation and the P-channel latch providing the complementary amplification operation. Thus, it can be seen that the operations of the P-channel latch 1 and the N-channel latch 2 are unaffected by whether the memory cell addressed lies in the left half bit line segment or the right half bit line segment. The only constraint on use of a dual sense amplifier construction as shown in FIGS. 3 and 4, is that the memory charge value must be subjected to amplification by both the P-channel latch and the N-channel latch to produce across the upper and lower bit lines a differential voltage which is equal to the full supply voltage level.

The above descriptions also hold true for sense operations to access the memory cells which are associated with the lower left bit line segment 445 and the lower right bit line segment 455.

As a result of the utilization of the divided bit line approach of the present invention, many more memory cells can be associated with a given bit line which is connected between the sense amplifier halves. More specifically, with a preferred embodiment having the bit line switch at the center of the bit line, approximately twice as many memory cells can be associated with a given bit line and sense amplifier.

In FIG. 5, the circuits of the P-channel latch 400 and the N-channel latch 405 are shown in greater detail.

In the P-channel latch 400, transistors $T_1$, $T_2$, $T_3$, and $T_4$, in the preferred embodiment, are of the P-channel CMOS construction. In the P-channel latch 400, the transistor $T_3$ is connected across the upper left bit line segment 440 and the lower left bit line segment 445. The gate of the transistor $T_3$ is connected to an external terminal PREP such that, when the transistor $T_3$ is turned on via a signal along the line PREP, the upper left bit line segment 440 is shorted to the lower left bit line segment 445. This operation is used prior to a sensing operation to ensure that the upper left bit line segment 440 and the lower left bit line segment 445 are at the same voltage levels. Also connected across the upper left bit line segment 440 and the lower left bit line segment 445 are transistors $T_1$ and $T_2$ connected in a cross-coupled arrangement. The remaining terminals of $T_1$ and $T_2$ are connected to a node 505 to which is also connected to a first terminal of a transistor $T_4$. The gate terminal of the transistor $T_4$ is connected to an external terminal PSET. The remaining terminal of the transistor $T_4$ is connected to a positive voltage supply, so that, when it is gated on via a signal along the line PSET, the transistors $T_1$ and $T_2$ are biased on, whereby they can respond and amplify a memory charge value sensed along either of the upper left or lower left bit line segments 440 or 445.

The N-channel latch 405 has a similar construction. A transistor $T_7$ and a cross coupled latch arrangement of $T_5$ and $T_6$ are connected across the upper right and lower right bit line segments 450 and 455, respectively. The remaining terminals of the transistors $T_5$ and $T_6$ are connected to a node 510. Also connected to the node 510 is a first terminal of the transistor $T_8$. The gate terminal of the transistor $T_8$ is connected to an external terminal NSET, and the remaining terminal of the transistor $T_8$ is connected to a negative voltage supply. The operation of the N-channel latch 405 is again similar to that of the P-channel latch 400.

Figure 6:
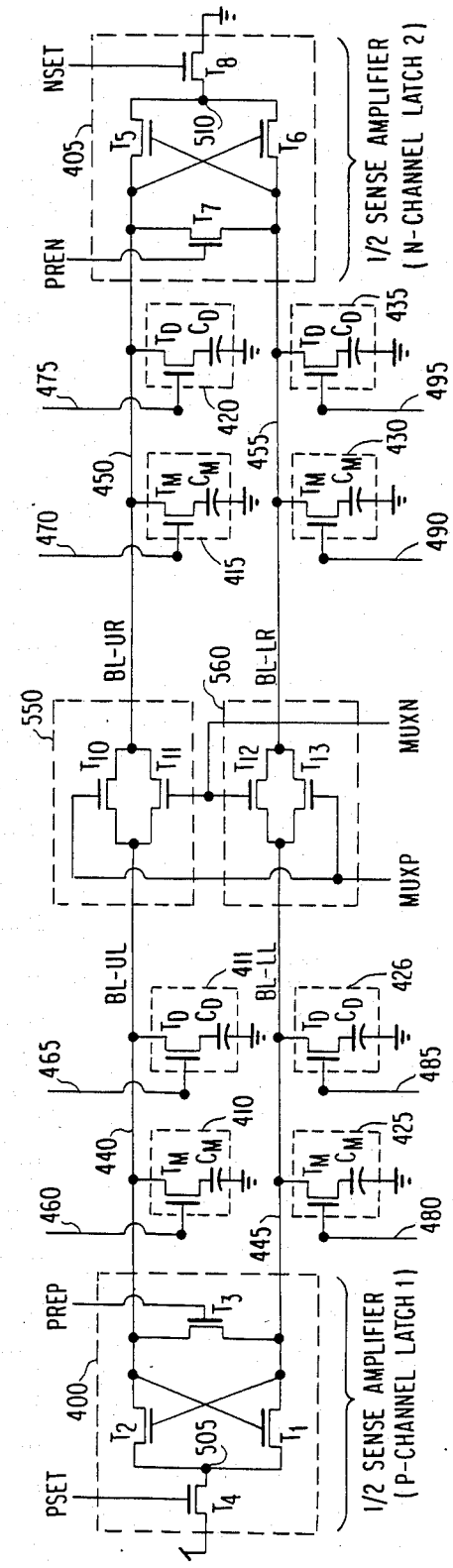
FIG. 6 is a simplified circuit diagram showing a preferred embodiment of an arrangement of multiplexers to provide the switched bit line isolation of the present invention.

Turning now to FIG. 6, the circuit of FIG. 5 is shown with the bit line switches implemented as a multiplexer A 550 and multiplexer B 560. The multiplexer A 550 is connected to the upper bit line, and the multiplexer B 560 is connected to the lower bit line. In a preferred construction of the multiplexer 550, the transistor $T_{10}$ is of a P-type CMOS construction, and the oppositely connected transistor $T_{11}$ is of an N-type CMOS construction. In a preferred construction, and the oppositely connected transistor of the N-channel CMOS construction, and the transistor $T_{13}$ is of the P-channel CMOS construction. The gate terminal of the transistor $T_{10}$ of the multiplexer 550 and the gate terminal of the transistor $T_{13}$ of the multiplexer 560 are connected to an external terminal MUXP. The gate terminal of the transistor $T_{11}$ of the multiplexer 550 and the gate terminal of the transistor $T_{12}$ of the multiplexer 560 are connected to the external terminal MUXN.

The operation of the preferred embodiment illustrated in FIG. 6 will now be described with reference to the timing waveforms shown in FIGS. 7A through 7K.

As shown in FIGS. 7G and 7H at a time $T=0$ the waveforms applied via the terminals PSET and NSET are such that transistors $T_4$ and $T_8$ are turned off. Since the transistor $T_4$ and $T_8$ are no longer operating as current sources, the cross coupled latch comprising $T_1$ and $T_2$, and the cross coupled latch comprising transistor $T_5$ and $T_6$, are effectively turned off. Thus, the sense amplifier halves 400 and 405 are effectively stopped from sensing and amplifying any charge values along the upper bit line or lower bit line. From times $T=0$ through time $T=2$, the waveforms applied to the MUXN and the MUXP terminals are, as shown in FIGS. 7I and 7J, such that the transistors $T_{10}$, $T_{11}$, $T_{12}$, and $T_{13}$ are conducting. With the transistors $T_{10}$ and $T_{11}$ conducting, the upper bit line segments 440 and 450 are effectively connected to complete the upper bit line. Similarly, with transistors $T_{12}$ and $T_{13}$ conducting, the lower bit line segments 445 and 455 are effectively connected to form the lower bit line.

Between times $T=1$ and $T=2$, a waveform as shown in FIGS. 7E and 7F is momentarily applied to terminals PREP and PREN such that the upper bit line is effectively shorted to the lower bit line, whereby the bit lines transfer charge between one another such that the upper and lower bit lines move to the same voltage level as indicated between times $T=1$ and $T=2$ in FIGS. 7A through 7D, thereby insuring that the bit line segments are at the same voltage levels before a sense operation is conducted.

At a time $T=3$, the waveform applied to the terminals MUXN and MUXP are such that the bit line switches (multiplexer 550 and the multiplexer 560) are effectively opened, whereby the upper left bit line segment and the lower left bit line segment are isolated from the upper right bit line segment and the lower right bit line segment, respectively. Thus, each bit line segment now contains only one-half the bit line length and bit line memory cells, and displays only one-half of the bit line capacitance.

In this description of the preferred embodiment, it is assumed that the contents of the memory cell 410 is to be sensed. Thus, in FIG. 7K, a waveform is applied to the word line 460 such that the isolation transistor $T_M$ of memory cell 410 is turned on. Also at a time $T=4$, the waveform, as shown in FIG. 7G applied to the PSET terminal (shown in FIG. 6), is such that the transistor $T_4$ is gated on. With the transistor $T_4$ turned on, the cross coupled latch comprising transistors $T_1$ and $T_2$ is effectively activated to amplify any memory charge values sensed along the upper left or lower left bit line segments 440 or 445.

With the isolation transistor $T_M$ of memory cell 410 gated on as described for FIG. 7K, a transfer of charge occurs between the memory cell capacitor $C_M$ and upper left bit line segment 440. As the transfer of charge occurs, the cross coupled latch comprising the transistors $T_1$ and $T_2$ senses and amplifies the memory charge value.

In the present description of the operation of the preferred embodiment of FIG. 6, it was assumed that a high logic value was stored in the memory cell capacitor $C_M$ of the memory cell 410. Thus, in the present example, a pre-amplification stage occurs with a high logical memory value being transferred to, and boosted along, the upper left bit line segment 440. FIG. 7A shows that the voltage along the upper left bit lin segment moves to a high voltage value between times $T=4$ and $T=5$. Note that between times $T=4$ and $T=5$, the upper right, lower left, and lower right bit line segments are still at the intermediate voltage level as indicated in FIGS. 7B through 7D respectively.

At a time $T=6$, the waveform applied to the terminals MUXN and MUXP (shown in FIG. 7I and 7J respectively) are such that the upper bit line switch 550 and the lower bit line switch 560 are closed to rejoin the left and right bit line segments. As the upper left bit line segment 440 has been reconnected to the upper right bit line segment 450, the upper right bit line segment is shown to move to a high logical voltage value, as indicated at time $T=6$ in FIG. 7C. Note that the rejoined lower left and lower right bit line segments still remain at an intermediate voltage level as can be seen at a time $T=6$ in FIGS. 7B and 7D respectively.

At a time $T=9$, the waveform applied to the terminal NSET (shown in FIG. 7H) is such that the transistor $T_8$ is turned on, whereby the cross coupled latch comprising transistors $T_5$ and $T_6$ is effectively activated to boost memory charge values sensed along the upper right bit line and lower right bit line. With the high voltage value appearing along the upper bit line being supplied to the cross coupled gate of transistor $T_6$, transistor $T_6$ is turned on to pull the lower voltage line to a complementary low logical voltage value. This is indicated by the voltage waveforms along the lower bit line segments being pulled low, as shown between $T=9$ and $T=10$ in FIGS. 7B and 7D.

Thus, it can be seen that the dual sense amplifier construction used in the preferred embodiment of FIG. 6 provides the two stage amplification operation. More specifically in the pre-amplification stage the cross coupled latch comprising $T_1$ and $T_2$ sensed the memory charge value along the upper left bit line segment, and provided a boosted high voltage level along the upper bit line. In the complementary amplification stage the cross coupled latch comprising transistors $T_5$ and $T_6$ provided the boosting of the lower bit line to a complementary low logic voltage value.

In using the preferred embodiment of an upper multiplexer switch 550 and a lower multiplexer switch 560, the memory cell capacitors $C_M$ of the memory array shown in FIG. 6 can be made smaller because the memory cell charge only has to satisfy only one-half of the bit line capcitance. Alternatively, more memory cells can be associated with a given bit line. Thus, with the preferred embodiment shown in FIG. 6, there is facilitated an approach to associate a greater number of memory cells along a given bit line disposed between a dual sense amplifier construction.

Turning now to the FIG. 8, there is shown a preferred embodiment which further utilizes the shared sense amplifier/folded bit line approach previously described with reference to the prior art. Shown in FIG. 8 is a dual sense amplifier constructed of a P-channel latch 800 and a N-channel latch 805. Associated with the dual sense amplifier construction are upper bit line segments 820, 825, 830 and 835, and lower bit line segments 840, 845, 850 and 855. Each of these eight bit line segments represent one-fourth of an upper or lower bit line. The bit line segments 820, 840, 825 and 845 are shown connectable to the P-channel latch 800 by multiplexer switches $MS_1$, $MS_2$, $MS_3$ and $MS_4$, respectively. This multiplexer arrangement is illustrated in the dashed area 860 which represents one-half of the shared dual sense amplifier. The bit line segments 830, 850, 835 and 855 are shown connectable to the N-channel latch 805 by multiplexer switches $MS_5$, $MS_6$, $MS_7$ and $MS_8$ respectively. This multiplexer arrangement is illustrated in the dashed area 865 which represents the second one-half of the shared dual sense amplifier.

The upper and lower bit line segments 825 and 845 are shown connectable to the upper and lower bit line segments 830 and 850 by upper and lower bit line switches 810 and 815, respectively, which provide the divided bit line isolation of the present invention.

Note that, if multiplexer switches $MS_3$, $MS_4$, $MS_5$ and $MS_6$ were closed, the combination consisting of the P-channel latch 800, the N-channel latch 805, the bit line segments 825, 830, 845 and 850, and the upper and lower bit line switches 810 and 815 would represent the circuit previously described with reference to FIG. 4. The sensing operation with this combination is the same as was described for FIG. 4.

In FIG. 8, it can be seen that the P-channel latch 80 and the N-channel latch 805 are additionally shared by the bit line segments 820, 840 and 835, 855, respectively.

Thus, the shared sense amplifier approach has been achieved with the present invention.

In FIG. 8, the folded bit line approach is also achieved by defining the following bit line segment pairs: 820 and 840; 825 and 845; 830 and 850; and 835 and 855. As an example showing the operation of the shared sense amplifier/folded bit line construction of FIG. 8, a sense operation with the bit line segment pair 820 and 840 will now be described.

Before a sense operation is begun, the multiplexer switches $MS_1$–$MS_8$ are closed to connect the upper bit line segments and the lower bit line segments. Once connected, the upper bit line is shorted to the lower bit line to insure that all the bit line segments are at the same voltage level. To sense a memory value along the upper bit line segment 820, the multiplexer switches $MS_3$ and $MS_4$ are opened to isolate the bit line segment pair 820, 840, and the P-channel latch 800 from the remainder of the circuit. Once isolated the appropriate memory cell (not shown) along upper bit line segment 820 is addressed to transfer the memory charge to the line. Note that, in the embodiment of FIG. 8, the memory charge has to satisfy only one-fourth of the total upper bit line capacitance. The P-channel latch 800 senses the memory charge and supplies the necessary pre-amplified stage. Once the sensed memory charge has been pre-amplified, the remaining bit line capacitances are no longer of concern. Thus, multiplexer switches $MS_3$ and $MS_4$, and the upper and lower bit line switches 810 and 815 are closed to allow the charge to be transferred and supplied to the N-channel latch. Since the amplified memory charge is supplied to the N-channel latch 805, the second stage of complementary amplification is provided. Thus, the sensed memory charge value is amplified to a full voltage supply differential voltage across the upper and lower bit lines. With the arrangement of FIG. 8, approximately four times as many memory cells (not shown) can be associated along a given bit line.

There has bee disclosed the improved divided bit line isolation approach of the present invention. This improvement allows a greater number of memory cells to be associated along a given bit line or alternatively, allows small capacitor cells to be constructed. As a result, dynamic memory devices having denser memory arrays can now be constructed more cheaply.

The present invention and many of its intended advantages will be understood from the foregoing description, and it will be apparent that various changes may be made in the form, construction and arrangement of the parts thereof, without departing from the spirit and scope of the invention, the form hereinbefore described being merely preferred or exemplary embodiments thereof. The scope of the invention is defined by the following claims.

What is claimed is:

1. a memory array device with divided bit line isolation, comprising:
    dual sense amplifier means for sensing logical memory values, said dual sense amplifier means being constructed of a first latch and a second latch;
    at least one bit line disposed to allow electrical interconnection between said first and second latch, said at least one bit line having a first end electrically connectable to said first latch, and a second end electrically connectable to said second latch; and switch means disposed to divide said at least one bit line into a first bit line segment and a second bit line segment, said switch means providing electrical connection between said first and second bit line segments when said switch is closed, and providing electrical isolation between said first and second bit line segments when said switch means is open.

2. A memory array device as claimed in claim 1, wherein said first latch is constructed of N-channel transistors, and wherein said second latch is constructed of P-channel transistors.

3. A memory array device as claimed in claim 1, wherein said switch means is of semiconductor construction.

4. A memory array device as claimed in claim 1, wherein said dual sense amplifier means and said switch means are of CMOS semiconductor construction.

5. A memory array device as claimed in claim 1, wherein there are two bit lines disposed between said first and second latch.

6. A memory array device as claimed in claim 5, wherein said two bit lines are used in a folded bit line approach.

7. A memory array device as claimed in claim 1, wherein said switch means is disposed at the center of said at least one bit line to divide said at least one bit line into a first bit line half and a second bit line half.

8. A memory array device as claimed in claim 7, wherein a plurality of bit lines is associated with said dual sense amplifier means, each of said bit lines being electrically connectable to said dual sense amplifier means by multiplexer switch means.

9. A memory array device as claimed in claim 1, wherein said at least one bit line has a plurality of memory cells disposed along its length, said switch means dividing said plurality of memory cells into a first portion of memory cells disposed along said first bit line segment, and a second portion of memory cells disposed along said second bit line segment.

10. A memory array device as claimed in claim 1, wherein said switch means is at least one field-effect transistor, the base terminal of said at least one field effect transistor being used to provide the open and closed selection of said switch means.

11. A memory array device as claimed in claim 1, wherein said switch means comprises a P-channel field-effect transistor, and an N-channel field-effect transistor.

12. A memory array device with divided bit line isolation, comprising:
  dual sense amplifier means for sensing logical memory values, said dual sense amplifier means being constructed of a first latch and a second latch;
  at least one bit line disposed to allow electrical interconnection between said first and second latch, said at least one bit line having a first end electrically connectable to said first latch, and a second end electrically connectable to said second latch, said at least one bit line having a plurality of memory cells disposed along its length; and
  switch means, disposed at approximately the midpoint of said at least one bit line, to divide said at least one bit line into a first bit line half having a first portion of said memory cells disposed along its length, and a second bit line half having a second portion of said memory cells disposed along its length, said switch means providing electrical connection between said first and second bit line halves when said switch is selected closed, and providing electrical isolation between said first and second bit line halves when said switch means is selected open.

13. A method of providing a memory array device with divided bit line isolation comprising;
  providing dual sense amplifier means for sensing logical memory values, said sense amplifier means being constructed of a first latch and a second latch;
  providing at least one bit line disposed to allow electrical interconnection between said first and second latch, said at least one bit line having a first end electrically connectable to said first latch, and a second end electrically connectable to said second latch; and
  providing a switch means disposed to divide said at least one bit line into a first bit line segment and a second bit line segment, said switch means for providing electrical interconnection between said first and second bit line segments when said switch is selected closed, and providing electrical isolation between said first and second bit line segments when said switch means is selected open.

14. An improved CMOS sense amplifier comprising:
  a P-channel latch;
  an N-channel latch;
  a pair of bit lines electrically interconnecting said latches; and
  a switch placed approximately at the electrical midpoint between said P-channel latch and N-channel latch in each said bit line and adapted to prevent current flow in said pair of bit lines prior to a read signal being applied to one or another half of said pair of bit lines.

15. A memory array device as claimed in claim 14, wherein said switch is of semiconductor construction.

16. A memory array device as claimed in claim 14, wherein said P-channel and N-channel latches and said switch are of CMOS semiconductor construction.

17. A memory array device as claimed in claim 14, wherein a plurality of bit lines is associated with said P-channel and N-channel latches, each of said bit lines being electrically connectable to said dual sense amplifier means by a multiplexer switch.

18. An improved sense amplifier construction comprising:
  a P-channel latch;
  an N-channel latch;
  a pair of bit lines electrically interconnecting said latches; and
  a switch placed approximately at the electrical midpoint between said P-channel latch and N-channel latch in each said bit line to divide each bit line into a first segment and a second segment, said switch being adapted to prevent current flow between said first and second segments during times when a read operation is being conducted along one of said first and second segments.

19. A method of providing divided bit line isolation to a memory array comprising:
  providing a memory array having a dual sense amplifier constructed of a first latch disposed at a distance from a second latch;
  providing at least one bit line electrically interconnecting said first and second latches;

providing switch means to divide said at least one bit line into a first bit line segment and a second bit line segment; and selecting said switch means open, during times when a read operation is being conducted along one of said first and second bit line segments, to prevent electrical current flow between said first and second segments.

20. A memory array device with divided bit line isolation, comprising:

first bit line means and second bit line means, each having first and second ends;

dual sense amplifier means for sensing and amplifying, along said first and second bit line means, bit line voltages coresponding to logical memory values, said dual sense amplifier means being constructed of N-channel first latch means connectable to said first ends of said first and second bit line means and P-channel second latch means connectable to said second ends of said first and second bit line means; and switch means disposed to divide said first and second bit line means each into first and second bit line segments, said switch means providing electrical connection between respective said first and second bit line segments of each of said first and second bit line means when said switch means is closed, and providing electrical isolation between respective first and second bit line segments of each of said first and second bit line means when said switch means is open;

wherein said switch means is opened to provide electrical isolation at a time prior to performing a pre-sensing and -amplifying operation with one of said first and second latch means, and then said switch means is closed to provide electrical connection to perform a complementary-sensing and -amplifying operation with an opposite one of said first and second latch means which was not used to perform said pre-sensing and -amplifying operation.

21. A method of providing a memory array device with divided bit line isolation, comprising the steps of:

providing first bit line means and second bit line means, each having first and second ends;

providing dual sense amplifier means for sensing and amplifying, along said first and second bit line means, bitline voltages corresponding to logical memory values, said dual sense amplifier means being constructed of N-channel first latch means connectable to said first ends of said first and second bit line means and P-channel second latch means connectable to said second ends of said first and second bit line means;

disposing switch means to divide said first and second bit line means each into first and second bit line segments, said switch means providing electrical connection between respective said first and second bit line segments of each of said first and second bit line means when said switch means is closed, and providing electrical isolation between respective first and second bit line segments of each of said first and second bit line means when said switch means is open;

opening said switch means to provide electrical isolation at a time prior to performing a pre-sensing and -amplifying operation with one of said first and second latch means; and at a time subsequent to said pre-sensing and -amplifying, closing said switch means to provide electrical connection to perform a complementary-sensing and -amplifying operation with an opposite one of said first and second latch means which was not used to perform said pre-sensing and -amplifying operation.

* * * * *